United States Patent [19]

Kitamura

[11] 4,443,695

[45] Apr. 17, 1984

[54] APPARATUS FOR CONTROLLING THE QUANTITY OF LIGHT

[75] Inventor: Takashi Kitamura, Yokohama, Japan

[73] Assignee: Canon Kabushiki Kaisha, Tokyo, Japan

[21] Appl. No.: 225,345

[22] Filed: Jan. 15, 1981

[30] Foreign Application Priority Data

| Jan. 25, 1980 [JP] | Japan | 55-7643 |
| Jan. 28, 1980 [JP] | Japan | 55-8621 |
| Jan. 30, 1980 [JP] | Japan | 55-9741 |
| Jul. 17, 1980 [JP] | Japan | 55-98520 |

[51] Int. Cl.³ .................. G01D 15/14; G01J 1/32
[52] U.S. Cl. ................... 250/205; 346/160; 250/214 AG
[58] Field of Search ............ 250/205, 209, 214 AG; 372/43; 346/160, 108

[56] References Cited

U.S. PATENT DOCUMENTS 4,059,833 11/1977 Kitamura ................... 346/108
4,092,530 5/1978 Wise ........................... 250/205

Primary Examiner—William L. Sikes
Assistant Examiner—Darwin R. Hostetter
Attorney, Agent, or Firm—Fitzpatrick, Cella, Harper & Scinto

[57] ABSTRACT

Control apparatus for controlling the quantity of light includes a light emitting device for emitting light in response to a driving signal applied thereto, a photodetector for receiving the light to produce a detection signal representative of the quantity of the light received, a comparator for comparing the detection signal with a reference signal, a circuit for applying a recording signal to the light emitting device, a start control responsive to an instruction signal which causes the control apparatus to start controlling the quantity of light during the time period when no recording signal is applied, an incrementing device for incrementing the driving signal to be applied to the light emitting device in response to the instruction signal received, and a stopping circuit for stopping the incrementing in response to the comparator to hold a count which is contained in the incrementing device when stopping, until the instruction signal is subsequently applied. The light emitting device may include an array of light emitting elements.

18 Claims, 10 Drawing Figures

APPARATUS FOR CONTROLLING THE QUANTITY OF LIGHT

BACKGROUND OF THE INVENTION

1. Field of the Invention

The present invention relates to apparatus for controlling the quantity of light or radiation emitted from a light emitting element to a selected level.

2. Description of the Prior Art

Light emitting elements such as a semiconductor laser are generally very sensitive to temperature and their optical output is unstable under atmospheric conditions that include variable temperature. Therefore, under the condition of variable temperature, it is required to stabilize the optical output from the semiconductor laser by employing any suitable means.

Hitherto, semiconductor lasers have often been used as a light source in optical telecommunications systems or the like and various types of circuits have already been proposed to stabilize the optical output from such semiconductor lasers. In such type of circuit the semiconductor laser is driven by an input signal obtained by modulating the carrier wave by means of digital information signals. Therefore, in this case, an effective stabilization of the optical output can be attained by feeding back the mean or maximum value of outputs. However, in another type of apparatus such as a laser beam printer, the semiconductor laser is driven directly by information signals without a carrier wave. In this case, it is impossible to use the mean-value feedback method. When the maximum value feedback method is employed, a photodetector has to be used which has a very high response speed. This is disadvantageous in view of economy.

SUMMARY OF THE INVENTION

Accordingly, it is an object of the invention to provide apparatus for controlling the quantity or intensity of radiation with a simplified structure.

It is another object of the invention to provide apparatus for controlling the quantity of light which is suitable for use in recording apparatus employing a beam of light.

It is a further object of the invention to provide apparatus for controlling the quantity of radiation which is suitable for controlling a plural number of beams of light.

It is still a further object of the invention to provide apparatus for controlling the quantity of radiation that uses a photodetector which is relatively low in the speed of response to light.

BRIEF DESCRIPTION OF THE DRAWINGS

These and further objects, features and advantages of the invention will appear more fully from the following description of preferred embodiments explained with reference to the accompanying drawings, in which.

DESCRIPTION OF PREFERRED EMBODIMENTS

Figure 1:
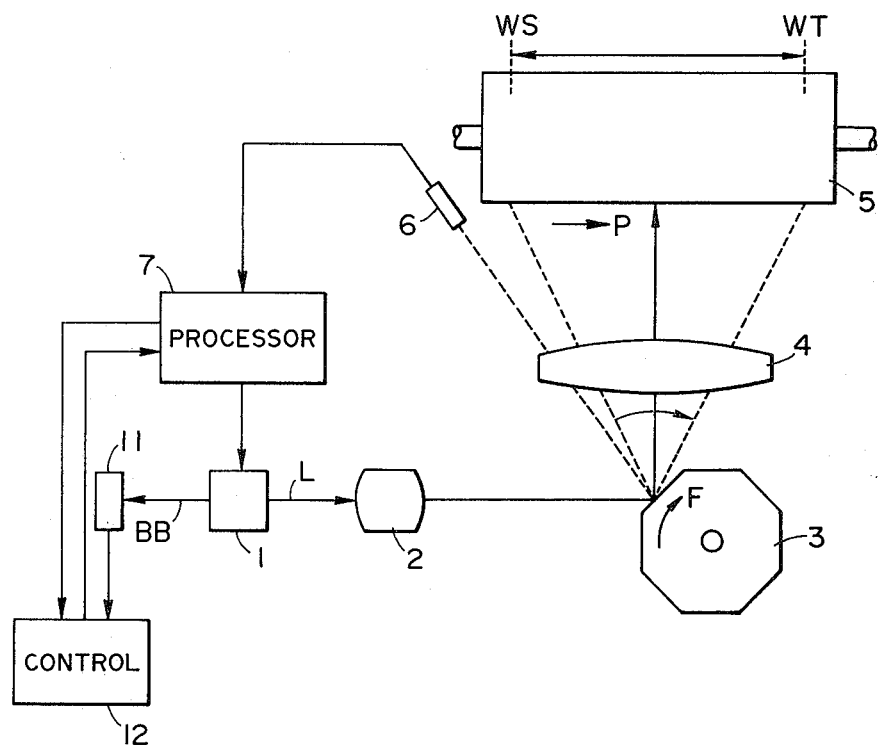
FIG. 1 is a schematic block diagram of a recording apparatus to which the present invention is applicable.

Referring first to FIG. 1 there is shown a beam recording apparatus in which the present invention is embodied. A semiconductor laser 1 emits a beam of laser light L which is directed to a rotary polygonal mirror 3 after passing through a collimator lens 2. The polygonal mirror rotates in the direction of arrow F at a uniform speed and it constitutes a deflector. The laser beam deflected by the polygonal mirror 3 is focused on a photosensitive drum 5 through a focusing lens 4. The photosensitive drum constitutes a part of an electrostatic recording apparatus. As the polygonal mirror 3 rotates in the manner mentioned above, the focused spot moves in the direction of arrow P. Therefore, all of the area on the drum 5 can be scanned with the laser beam when the drum is rotated in a determined direction at a uniform speed while rotating the polygonal mirror 3 at a high speed.

Designated by 6 is a beam detector provided outside of the information recording area on the drum 5. The detector 6 detects the entrance of beam L to form a timing signal which is in turn applied to a processor 7. At the timing controlled by the timing signal, the processor applies a recording signal to the semiconductor laser 1. Therefore, the laser 1 emits a laser beam modulated with the recording signal. This controlling process of a laser beam is well known in the art, for example, from U.S. Pat. No. 4,059,833 and therefore will not be further described.

The photosensitive drum 5 which is subjected to irradiation by the laser beam modulated with the recording signal in the above-mentioned manner, has previously been electrically charged by a charger (not shown) throughout all the drum surface uniformly. Therefore, when the drum surface is exposed to the modulated laser beam, there is formed an electrostatic latent image in accordance with the irradiated beam on the previously charged drum. The electrostatic latent image is then visualized by a developing device (not shown) and the developed image is transferred onto a transfer material such as a sheet of paper. The transferred image on the transfer sheet is fixed by a fixing device (not shown). Thus, a recording sheet having an image formed according to the applied recording signal is obtained.

The semiconductor laser 1 emits the laser beam not only forwards as front beam L but also backwards as back beam BB. The back beam BB is received by a photodetector 11 which forms a detection signal corresponding to the intensity of the received beam. The detection signal is applied to a control circuit 12 to control the intensity of the beam emitted from the semiconductor laser 1.

Figure 2:
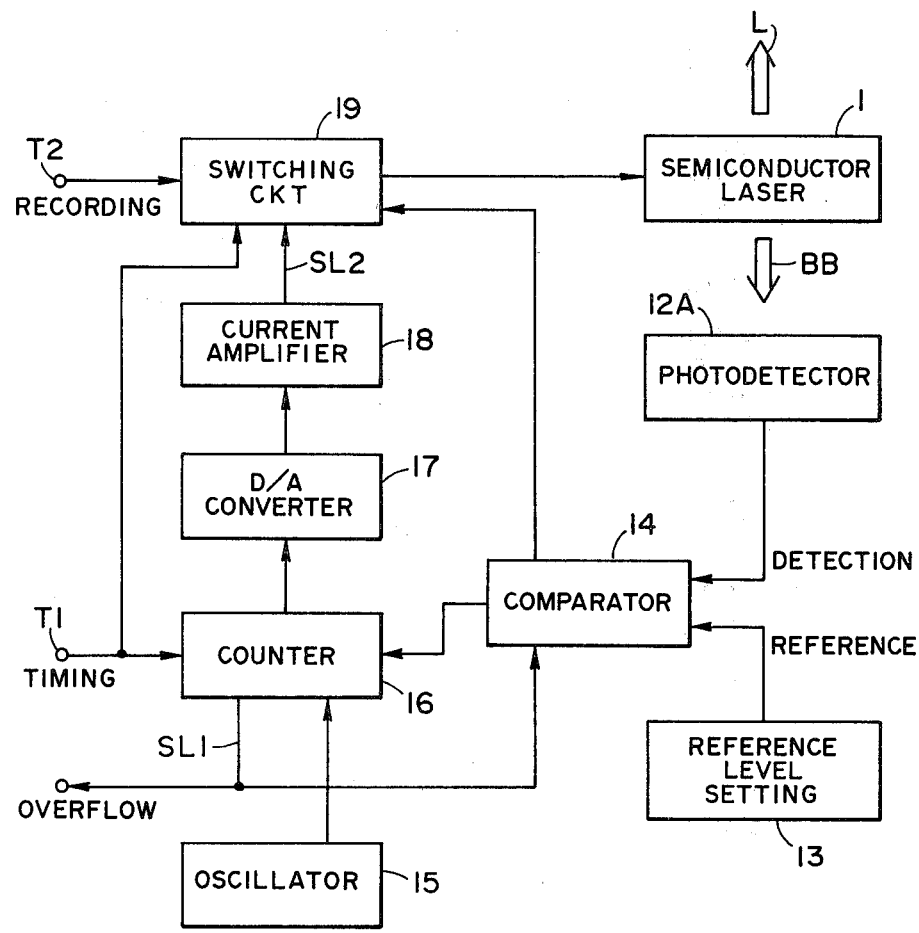
FIG. 2 is a schematic block diagram of apparatus for controlling the quantity of radiation according to the invention.

FIG. 2 is a detailed circuit diagram of apparatus for controlling the quantity of light or radiation used as a part of the above controller 12 and processor 7 according to the invention.

In FIG. 2, reference numeral 13 designates a reference level setting circuit which issues a reference signal of fixed potential and 14 designates a comparator which compares the level of a detection signal from the photodetector 12A with that of a reference signal from the reference level setting circuit 13. When the former signal becomes larger than the latter, the comparator stops the operation of a counter 16. Designated by 15 is an oscillator which oscillates signals having a certain determined frequency. The counter 16 is connected to the oscillator 15 and counts the signals from the oscillator. When a timing signal is applied to the counter from a terminal T1, the counter 16 starts counting. If the counting is not stopped by the output from the comparator 14 even after the counter 16 has counted up to a predetermined value N2, then an overflow signal is issued to clear the counter. Thereby the counter is stopped operating and also the comparator is stopped at the same time.

Reference numeral 17 is a digital-to-analog (D/A) converter which converts the value counted by the counter 16 into a corresponding analog value. Connected to the D/A converter 17 is a current amplifier 18 which amplifies the analog signal. Numeral 19 denotes a switching circuit which operates according to the recording signal applied thereto from terminal T2 in such a manner that when the switching circuit is turned on by a digital signal "1" applied thereto from terminal T2, it applies to the semiconductor laser 1 the current on the signal line SL2 and when turned off by a digital signal "0" from T2 it does not apply any current to the semiconductor laser 1.

The beam recording apparatus described above has an idle time between the end of recording images on one page and the start of recording on the next page. During this idle time there is applied a timing signal from terminal T1 to keep the switching circuit 19 on and to start the counting operation of the counter 16 after clearing it.

After starting the counter 16 in this manner, the value N counted by the counter increases one by one and therefore the current on signal line SL2 also increases incrementally with the increase of the counted value N. In response to it the intensity of the beam emitted from the semiconductor laser 1 is increased up incrementally also. This counting operation continues until the detection signal has become higher than the reference signal.

Assuming that the detection signal becomes higher than the reference signal when the counter 16 gets to a count Na, the counting operation of the counter is stopped in response to an output from the comparator 14 at the time of counting up the value Na. The counter 16 holds the value Na until the next timing signal is applied thereto and the state of on of the switching circuit 19 is cleared. Therefore, during this period, there exists on the signal line SL2 a current Ia corresponding to the count Na. When a recording signal is applied to terminal T2, the semiconductor laser 1 is driven in accordance with the current Ia.

If no counter stop signal is issued from the comparator 14 due to any trouble in photodetector 12A even after the counter 16 has reached the preset count N2, then an overflow signal is delivered to the signal line SL1 to stop the comparator 14 and clear the state of on of the switching circuit 19. The counter 16 is cleared and then returned to its initial position (count is N1).

In this manner, the semiconductor laser is protected from damage by reducing the driving current if the current on the signal line SL2 becomes so large as to damage the laser 1.

Figure 3:
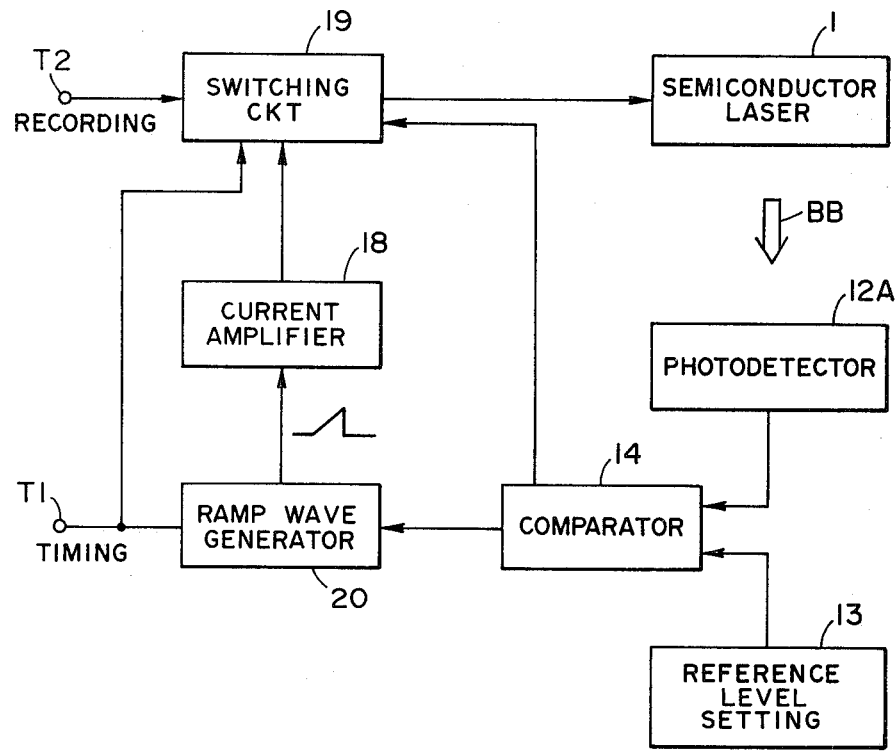
FIG. 3 is a schematic block diagram of another embodiment.

In the embodiment shown in FIG. 3, the oscillator 15, counter 16 and D/A converter used in FIG. 2 embodiment are replaced by a ramp wave generator 20 the output level of which rises with time. The ramp wave generator 20 starts generating ramp waves upon the time of application of a timing signal to terminal T1. In response to an output from the comparator 14 it holds the output level present at that time. The manner of operation of other parts of FIG. 3 embodiment corresponds to that of the FIG. 2 embodiment and therefore will not be further described. The same reference numerals designate the same or corresponding parts of the circuit shown in FIG. 2.

In the embodiments shown in FIGS. 2 and 3, the timing signal has been described to be issued during an idle time between the completion of recording of one page on the drum 5 by laser beam L and the start of recording of the next page. Also, the recording of the next page has been shown to be started after completing the adjustment of the quantity of light. However, the timing signal may be issued during the time of the laser beam L being moved from the position of beam detector 6 to the left edge WS of the transfer area (WS-WT) on the drum 5. The adjustment of light also may be carried out before the beam reaches the left edge WS.

In the above embodiments, the photodetector has been shown to receive the back beam from the semiconductor laser. However, it is possible to use the front beam for the photodetector. For example, a part of the front beam may be directed to the photodetector. Alternatively, the front beam may be guided to the photodetector by using an optical system during only the period of control for quantity of light.

Also, in the above embodiments, a bias may be applied to the current amplifier 18 to cause an initial current flow into the switching circuit 19. By doing so, the dynamic range of the system can be broadened to some extent.

While in the above embodiments the present invention has been applied to a beam recording apparatus in which a single laser beam is emitted from a single semiconductor laser, the invention may be applied to another type of recording apparatus in which a plural number of laser beams are emitted from a semiconductor laser formed as a semiconductor laser array and those laser beams are controlled separately from each other.

In the case of a semiconductor laser array, the individual laser devices are arranged very closely and the distance between the neighbouring devices is in the order of about 100 μm. Therefore, in order to detect the optical outputs of the individual laser beams independently of each other, a particular optical system for enlarging the distance between the beams or a group of detectors arranged at the same intervals as those of the laser array is required which in turn makes the apparatus expensive. In addition, high accuracy is required for alignment.

Figure 4:
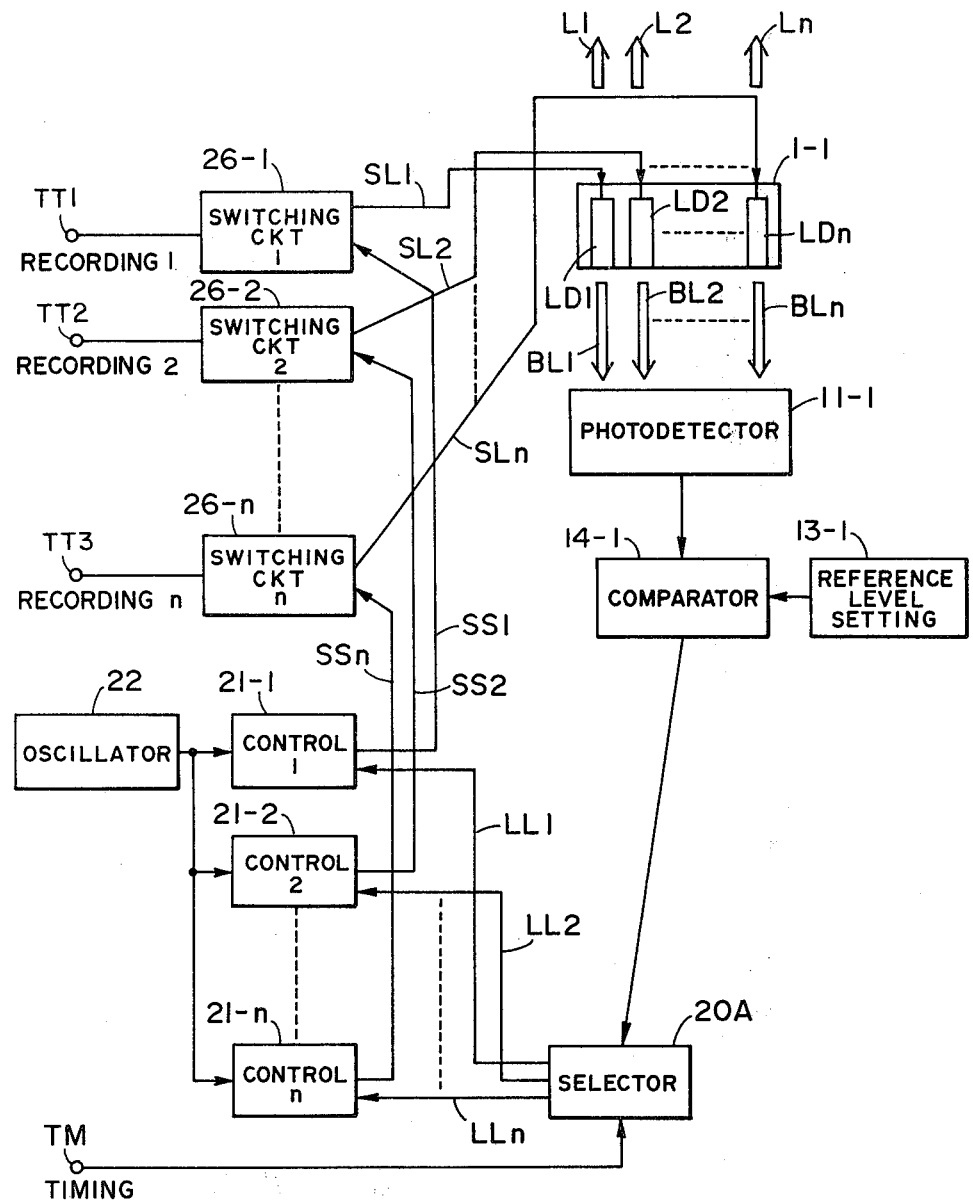
FIG. 4 is a schematic block diagram of a further embodiment suitable for sequential control of the quantity of radiation from a plural number of beams.

These disadvantages are eliminated by the embodiment shown in FIG. 4 which is applicable to a beam recording apparatus as shown in FIG. 1. According to this embodiment, laser devices of a semiconductor laser array are enabled one by one sequentially for carrying out the necessary control of the intensity of the respective beams.

In FIG. 4, a semiconductor array 1-1 comprises a number of semiconductor devices $LD_1$ to $LD_n$. These devices are selectively driven by selectively applying a driving signal. For example, by applying a driving signal to the first semiconductor device $LD_1$, the latter is driven so that a front beam $L_1$ is emitted from the device forwardly and at the same time a back beam $BL_1$ is emitted from the same device backwardly. Similarly, when the second device $LD_2$ is driven by a driving signal, it emits front beam $L_2$ and back beam $BL_2$. A photodetector 11-1 receives the back beams BL from the selectively driven devices and forms a detection signal corresponding to the intensity of each received beam. The detection signal is applied to a controller 12 as shown in FIG. 1 to control the intensity of the beam emitted from the semiconductor elements LD. In this manner, control of intensity of laser beams is carried out one by one for all of the devices of the semiconductor laser array 1-1.

In the detailed circuit diagram of this embodiment shown in FIG. 4, reference numeral 13-1 is a reference level setting circuit which generates a reference signal of a fixed potential, and 14-1 is a comparator for comparing the above-described detection signal from the photodetector 11-1 with the reference signal from the reference level setting circuit 13-1. When the detection signal becomes higher than the reference signal, the comparator stops the counting operation of a counter 23 as later described in detail through a selector 20A. The selector 20A is used to select any one of the controls 21-1 to 21-n to which the comparison output from the comparator 14-1 is to be applied. More particularly, the selector 20A selects control circuit 21-1 when the first timing signal is applied to terminal TM and selects control circuit 21-2 when the second timing signal is applied. In this manner, the selector 20A selects one of the control circuits 21 according to the timing signal applied to terminal TM. The respective control circuits 21 also receive oscillating signals from oscillator 22. Each the control circuit 21 has the same structure as shown in FIG. 5.

Figure 5:
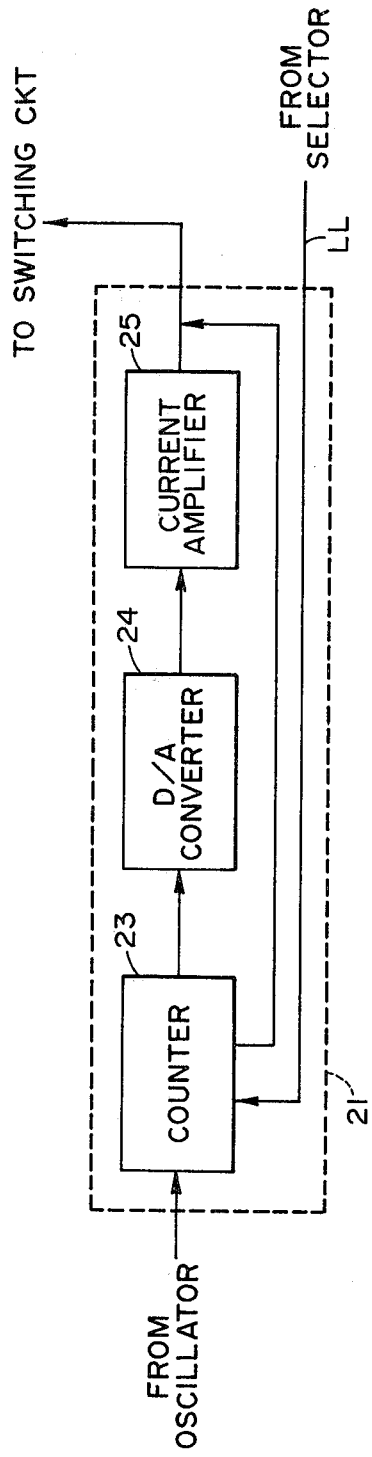
FIG. 5 is a schematic block diagram of the circuit shown in FIG. 4.

In FIG. 5, reference numeral 23 designates a counter for counting the oscillating signals from the oscillator 22. The counter starts counting when a selection signal is applied to signal line LL from the selector 20. When there is applied from the comparator 14-1 an instruction signal informing that the detection signal is higher than the reference signal, the counter stops counting and holds its content, namely counted value Na. The counted value Na is converted into a corresponding analog value by D/A converter 24. The analog signal thus obtained is amplified by a current amplifier 25. Output from the amplifier 25 is applied to a corresponding switching circuit 26 over signal line SS. The switching circuit 26 operates in accordance with the recording signal applied to terminal TT in such a manner that when the switching circuit is turned on it applies to the semiconductor laser device LD the current then existing on the signal line SS and when turned off, it applies no current to the laser device LD.

The manner of operation of the above-described beam recording apparatus will now be discussed.

When the first timing signal is applied from terminal TM, the selector 20 produces a selection signal on the signal line $LL_1$. With the application of such a selection signal, the counter 23-1 of control circuit 21-1 starts counting the oscillating signals after clearing the counter. At the same time, the switching circuit 26-1 is held in the state of on. The counted value by the counter is converted into an analog form and then the current is amplified. Thus, a current $i_1$ corresponding to the counted value appears on the signal line $SS_1$. Since the switching circuit 26-1 is on at the time, this current $i_1$ is applied to the semiconductor element $LD_1$. Therefore, the back beam $BL_1$ reaches the level of beam intensity corresponding to the counted value by counter 23-1. Counting continues until the detection signal from the photodetector 11-1 becomes larger than the reference signal. With the increase of counted value, the current $i_1$ also increases gradually and therefore the intensity of beam $BL_1$ becomes higher and higher. When the counter 23-1 counts up to Na, the detection signal becomes larger than the reference signal. At this time point, the comparator 14-1 issues an output to stop the counting operation of the counter 23-1. The value Na is held in the counter until it receives a selection signal again. Holding of the switching circuit 26-1 in the on state is cleared. On the signal line $SS_1$ there appears a current $i_a$ corresponding to the counted value Na. When a recording signal 1 is applied to terminal $TT_1$, the semiconductor device $LD_1$ is driven according to the current $i_a$.

A period of time $\Delta T$ after the issuance of a first timing signal $Tm_1$, a second timing signal $Tm_2$ is applied to terminal TM. When this second timing signal $Tm_2$ is provided to the selector 20, the selection signal existing on the signal line $LL_1$ is cancelled, and instead a selection signal is produced on the second signal line $LL_2$. Thereby the corresponding counter 23-2 is cleared and then initiated to count. At the same time, switch circuit 26-2 is turned on. The counter 23-2 continues counting in the same manner as above. When the counter counts up to a value Nb, the detection signal becomes higher than the reference signal. At this time point, the counting operation of counter 23-2 is stopped by an output from comparator 14-1. The counter 23-2 holds the counted value Nb until the next selection signal. Holding of the switching circuit 26-2 in the on condition is cleared. Therefore, on the signal line $SS_2$ there appears a current $i_b$ corresponding to the value Nb. When a recording signal 2 is applied to terminal $TT_2$, the second semiconductor device $LD_2$ is driven according to the current $i_b$.

In the manner described above, timing signals are issued at intervals of $\Delta T$ and values of current for driving the semiconductor devices LD are determined respectively. Thus, when the last timing signal Tmn is applied, the current $i_n$ on the last signal line $SS_n$ is determined.

By applying recording signals 1 to n to terminals $TT_1$ to $TT_n$ respectively after determining the last current $i_n$, it is assured that all of the semiconductor devices $LD_1$ to $LD_n$ emit laser beams of equal intensity.

Output of the timing signals described above must be carried out during the period when the beam recording apparatus is not in operation for recording. In beam recording apparatus there is generally some idle time available for this purpose between the end of recording on one page and the start of recording on the next page. Adjustment of light intensity regarding n semiconductor devices can be completed making use of such available time while applying the timing signals during appropriate periods.

Figure 6:
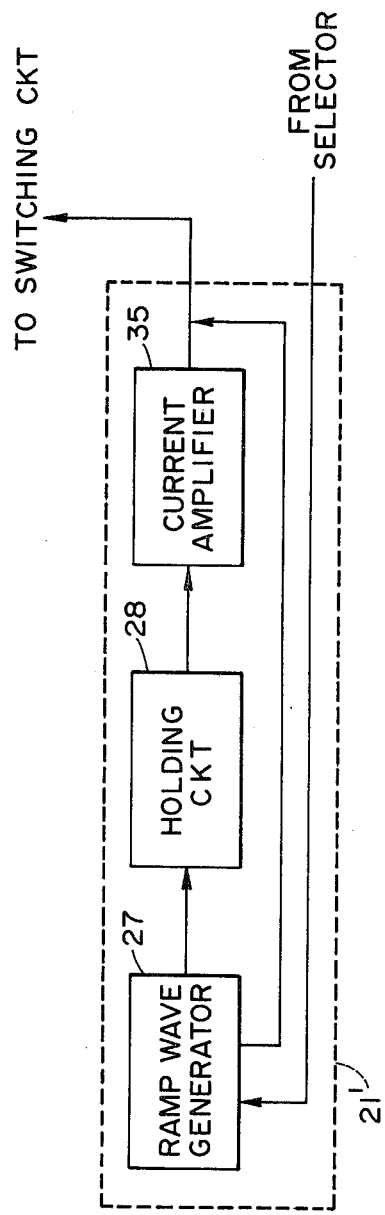
FIG. 6 shows a modification of the control circuit shown in FIG. 4.

FIG. 6 shows a modification of the control circuit 21 shown in FIG. 4. Use of the control circuit 21' shown in FIG. 6 makes the oscillator in FIG. 4 embodiment unnecessary.

In FIG. 6, reference numeral 27 designates a ramp wave generator whose output level rises with time. By applying a selection signal from the selector 20 the ramp wave generator 27 starts generating ramp waves and a holding circuit 28 holds the output level present at that time in response to an instruction signal from the comparator 14-1. The manner of operation of other parts of the circuit corresponds to that of the embodiment shown in FIG. 4.

While in the embodiment shown the photodetector has receives the back beam from the semiconductor laser, it is also possible to lead a part of the front beam to the detector or to make the front beam incident upon the detector using a particular optical system during only the control period. Further a bias may be applied to the current amplifier 25 to introduce an initial current to the switching circuit. By doing so, the dynamic range of the system can be broadened.

In the above two embodiments, the counter is once reset by means of a timing signal and thereafter it counts up. This means that it takes a certain time for the counter to count up to Na.

Figure 7:
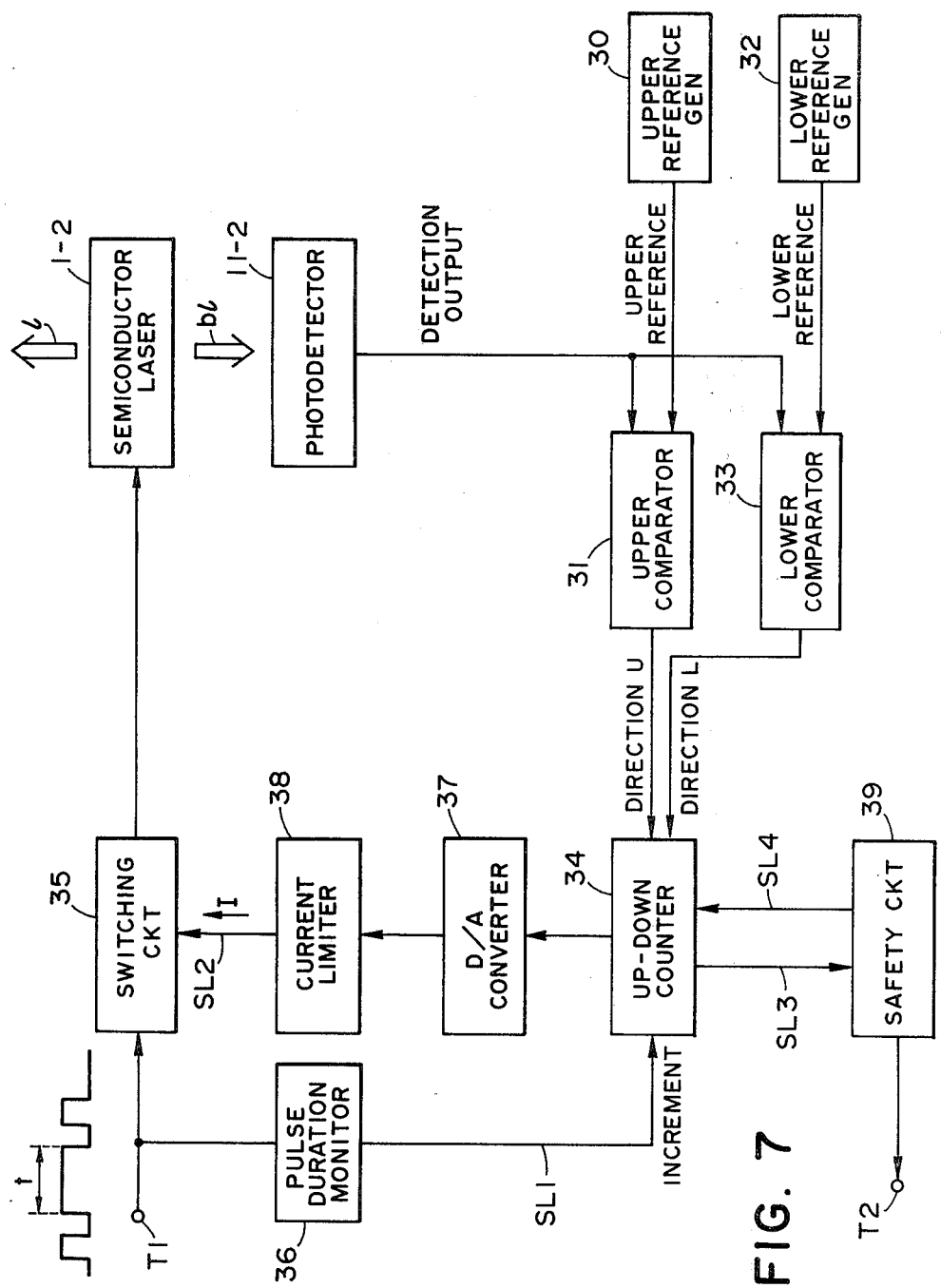
FIG. 7 is a schematic block diagram of a further embodiment of apparatus for controlling the quantity of radiation according to the invention.

To shorten the time required for counting, the following embodiment shown in FIG. 7 uses an up-down counter.

The embodiment of apparatus for controlling the intensity of light shown in FIG. 7 is intended to be applied to a beam recording apparatus as shown in FIG. 1 and the embodiment is described hereinafter with reference to such beam recording apparatus in which a semiconductor laser 1-2 emits a single beam.

In FIG. 7, reference numeral 11-2 designates a photodetector which receives the back beam b1 from the laser 1-2 and produces a detection output corresponding to the intensity of the received light. Reference numeral 30 is an upper reference generator which generates a reference signal indicative of the upper limit of the detection signal. The detection output and the upper reference signal are compared with each other in an upper comparator 31. Designated by 32 is a lower reference generator which generates a reference signal indicative of the lower limit of the detection output. The detection output and the lower reference signal are compared with each other in a lower comparator 33. In this embodiment, no control for adjusting the intensity of light is executed so long as the detection output remains within the range between the lower limit and the upper limit. Control of the intensity of radiation is carried out only when the detection output is out of the range.

Reference numeral 34 denotes an up-down counter. When the detection output is larger than the upper reference signal, a direction signal U informing of that it is issued from the upper comparator 31. In this state, the up-down counter 34 counts down one decrement by an instruction signal applied to the signal line SL1. On the contrary, when the detection signal is lower than the lower reference signal, the lower comparator 33 issues a direction signal L informing of this case. In this state the counter 34 counts up one increment by an instruction signal applied to the signal line SL1.

A recording signal (which is a digital signal) is applied to the semiconductor laser 1 through terminal T1 and a switching circuit 35. When the recording signal is applied to the switching circuit, it allows the current I on the signal line SL2 to flow into the semiconductor laser 1 according to the recording signal. However, if the recording signal is at its low level, then the switching circuit inhibits any current from flowing into the semiconductor laser 1. Namely, the current I is applied to the semiconductor laser 1 only when the recording signal is at its high level. The recording signal is also introduced into a pulse duration monitor 36 to check whether the high level duration of the recording signal is longer than a certain time t or shorter than the same. When the duration is longer than t, the monitor 36 delivers the above mentioned instruction signal to the counter 34.

The value of counts counted by the counter 34 is converted into an analog signal by D/A converter 37 and the analog signal is amplified by a current amplifier 38. The amplified signal is then introduced into the signal line SL2 as current I.

If a carry or a borrow is produced on the signal line SL3 from the counter 34 thereby bringing a safety circuit into operation, then a reset signal is produced on the signal line SL4 to reset the counter 34 and also to deliver a warning signal to terminal T2.

The manner of operation of the above-described apparatus for controlling the quantity of light is as follows:

For the purpose of explanation it is assumed that the apparatus is now under such a state of operation that the counter is holding a value Na, the semiconductor laser 1 is being driven with a current Ia corresponding to the counted value Na, the quantity of light LEa emitted from the laser is over the upper limit of a preset range and therefore the upper comparator 31 is applying a direction signal U to the counter 34 (of course, no instruction signal L is being produced).

In the above condition, if a recording signal whose high level duration is longer than time t is applied, then the pulse duration monitor 19 issues an instruction signal by which the counter is made to subtract 1 from Na. As a result, the content of the counter is reduced to N(a−1). With this decrease in counted value, the converted analog value by D/A converter decreases accordingly and therefore the current Ia is reduced to I(a−1). As a result, the quantity of light emitted from the semiconductor laser 1 is reduced to LE(a−1).

If the comparator 31 continues issuing its direction signal U after the first reduction of the emitted light, then the above controlling procedure is repeated again upon the arrival of recording signal of a longer high level duration than t. Thus, the counted value by the counter is further reduced to N(a−2) and therefore the current to I(a−2).

Assuming that the quantity of emitted light LE(a−2) comes just within the range of the upper level to the lower level, there is produced neither direction signal U nor direction signal L. Therefore, the counted value remains unchanged even when a further instruction signal is applied to the counter. The counter holds the value.

In the state opposite to the above wherein the value in the counter is Na, the quantity of emitted light LEa is under the lower limit of the set range and therefore the lower comparator 33 is issuing a direction signal L to the counter 34, the counter is made to add 1 to Na by an instruction signal from the monitor 36. Thus, the counted value by the counter is increased to N(a+1) and the current I is increased to I(a+1) accordingly. Consequently, the quantity of light emitted from the semiconductor laser 1-2 is increased according to the current (a+1).

As previously mentioned, the quantity of light emitted from the semiconductor laser 1-2 is strongly affected by atmospheric temperature. The quantity is reduced with rising of atmospheric temperature and if the temperature is very high there may occur a case where the semiconductor laser cannot easily attain the desired level of light intensity even after a considerable increase of the current I. In this case, the apparatus will continue increasing the current I until the quantity of light reaches the desired level. However, in this process of increasing the current I, there is the possibility that the semiconductor laser may be damaged by the excessively increased current. To prevent such damage, the present embodiment is so formed as to produce a carry signal when the counter 34 has reached a certain determined count value N2. At the issuance of such carry signal the counter 34 is reset to a value NR by a safety circuit 39. Thus, damage on the semiconductor laser can be prevented. At the same time, the safety circuit 39 gives a warning signal to terminal T2 to warn the operator of danger and warn him to carry out the necessary treatments. Naturally, the value NR is smaller than N2 and the current corresponding to NR can drive the semiconductor laser without damage or shortening of life. For example, the minimum count value of counter 34 may be selected as the value NR.

On the contrary, in case that the atmospheric temperature is very low there is the possibility that the quantity of light cannot reach the desired level within the set range even after decreasing the counted value Na through many steps. In this case, the counter 34 will issue a borrow after reaching the minimum count and then return again to its maximum count. To eliminate this trouble, in the present embodiment, the safety circuit 39 is actuated also when a borrow is issued from the counter. The safety circuit 39 resets the counter 34 to the above-mentioned value NR and also gives a warning signal at terminal T2.

In the above embodiment the counter has been shown and described to be operated only when the photodetector output is not in the range between preset upper and lower limits and employs four circuits, that are, upper and lower reference generators and upper and lower comparators.

Figure 8:
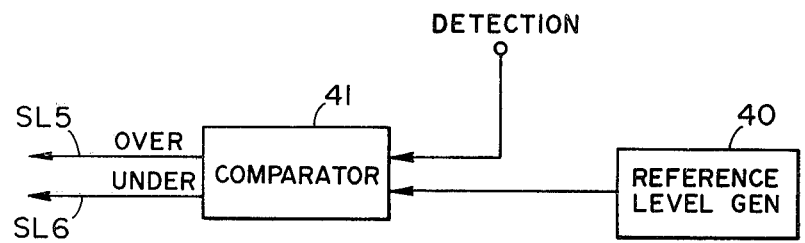
FIG. 8 shows a modification of the apparatus shown in FIG. 7.

FIG. 8 shows a modification of the above embodiment shown in FIG. 7. In the modification shown in FIG. 8, the four circuits mentioned above are omitted and instead a reference level generator 40 and a comparator 41 are provided. The comparator 41 is so formed as to compare the detection signal with the reference signal from the generator 40. When the detection signal is higher than the reference signal, the comparator gives an over signal to the signal line SL5 whereas when the former is lower than the latter it gives an under signal to the signal line SL6. An application of the abovementioned instruction signal when the over signal is applied to SL5 makes the counter 34 count down one decrement. On the contrary, an application of such instruction signal when the under signal is applied makes the counter count up one increment.

The control apparatus shown in FIG. 8 is composed of fewer component circuits and can be used with particular advantage for controlling the quantity of light the variable range of which is relatively narrow.

In the above embodiment, the control for the quantity of light has been effected with the arrival of a recording signal having a duration time longer than a predetermined value t during a recording operation. However, the control may be effected during the time of no recording operation by applying to terminal T1 a signal equivalent to the above recording signal having a duration time longer than t.

Figure 9:
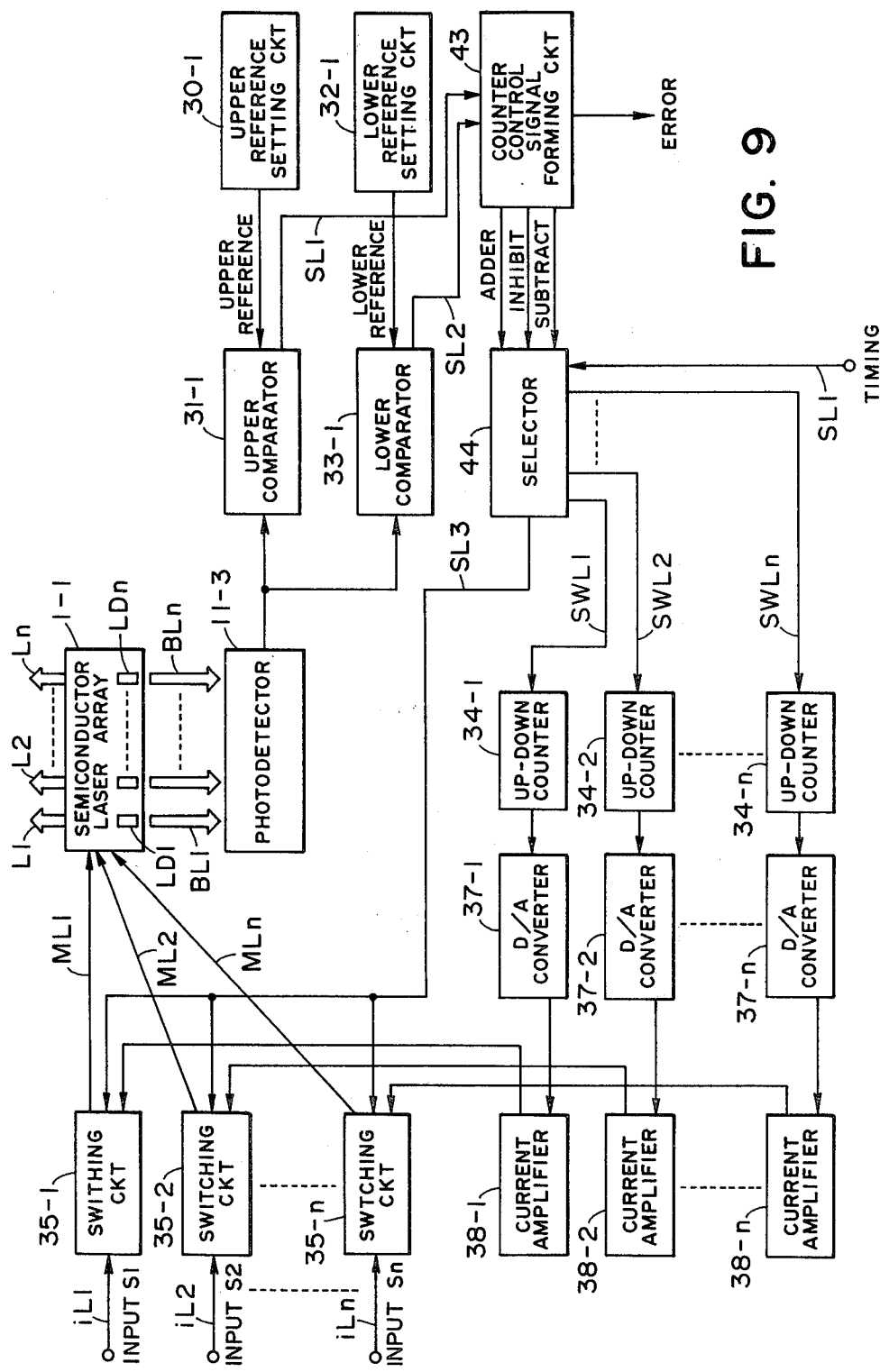
FIG. 9 is a schematic block diagram of apparatus for controlling the quantity of light adapted to sequentially control a plural number of beams in quantity or intensity of radiation.

FIG. 9 shows a further embodiment of the invention. Designated by 1-1 is a semiconductor laser array which emits a plural number of front laser beams L1-Ln and back beams BL1-BLn. The laser beams BL1-BLn are incident upon a photoreceptor of photodetector 11-3. The upper limit of the intensity of laser beam is optionally set by an upper reference setting circuit 30-1 and the lower limit thereof is optionally set by a lower reference setting circuit 32-1. From any selected one (selected by a selector 44 as later described) of the laser beams BL1-BLn detected by the photodetector 11-3 obtained is a signal informing of the intensity of the detected beam which is applied to an upper comparator 31-1. The upper comparator compares the intensity signal with the upper reference signal from the above upper reference setting circuit. When the former is higher than the latter, the comparator 31-1 issues a digital signal "1" to the signal line SL1. When the former is lower than the latter, it issues "0" to the signal line.

Similarly, the signal of intensity of the selected beam BL is applied to lower comparator 33-1 to compare it with the lower reference signal from the lower reference setting circuit 32-1. When the detected intensity of the beam is lower than the lower reference, the lower comparator issues a digital "1". When the former is higher than the latter, it issues "0" to the signal line SL2.

These signals appearing on the signal lines SL1 and SL2 are introduced into a counter control signal forming circuit 43. This signal forming circuit 43 forms a subtraction signal when the signals on SL1 and SL2 are 1 and 0, an addition signal when the signals on SL1 and SL2 are 0 and 1, an inhibition signal when 0 and 0, and an error signal when 1 and 1.

The addition, subtraction or inhibition signal is applied to a selected one of up-down counters 34-1-34-n through a selector 44. The selector 44 operates in response to a timing signal applied to signal line SL4 and selects sequentially one of the signal lines SWL1-SWLn and a switching circuit 35 corresponding to the selected signal line SWL.

Reference numerals 37-1-37-n are D/A converters for converting a counted value by the counter 34 into a corresponding analog signal. The analog signal is applied to a current amplifier 38 to convert the analog signal into a corresponding value of current. The current value is introduced into a switching circuit 35 to drive the semiconductor laser 1-1.

The manner of operation of the above apparatus will now be discussed.

In the normal state of recording, the control circuit shown in FIG. 9 has, at its switching circuits 35-1 to 35-n, current values determined by the current amplifiers 38-1 to 38-n and on and off of the switching circuits is controlled according to digital "0" or "1" of the input signals S1-Sn on the signal lines iL1-iLn. By turn-on of the switching circuits 35-1-35-n there are applied to signal lines ML1-MLn the currents determined by current amplifiers 38-1-38-n. Thus, the laser devices LD1-LDn are driven in accordance with the current levels applied thereto respectively. Control of the quantity of light is executed according to the procedure, discussed in the following, during the period in which no recording of data with the semiconductor laser array 1-1 is carrying out.

At first, a timing signal is applied to the signal line SL4 so tht the input signal S1 takes its high level 1 by means of the selector 44. The switching circuit 35-1 is turned on and the remaining switching circuits are off. Also, the signal line SWL1 is selected thereby.

Therefore, a current corresponding to the counted value by the counter 34-1 is now applied to the signal line ML1 to selectively drive only the laser device LD1 which emits laser beams L1 and LB1. The laser beam LB1 is received by the photodetector 11-3 which converts the intensity of the received light into an electrical signal (detection signal). The detection signal is compared with the upper reference signal and lower reference signal in the comparators 31-1 and 33-1. When the detection signal is higher than the upper reference signal, a subtraction signal is issued to subtract from the content of the counter 34-1. On the contrary, if the detection signal is lower than the lower reference signal, then an addition to the content of the counter is made by an addition signal. In this manner, the current applied to the signal ML1 is decreased or increased. When the level of the detection signal falls within the range of from above upper reference to lower reference, an inhibition signal is issued to make the up-down counter 34-1 hold its content.

After completing the intensity of laser beam L1, LB1 in the manner described above, a second timing signal is applied to signal line 4 to render the input signal S2 high level 1 so that the second switching circuit 35-2 is turned on and the remaining switching circuits are off. At the same time, the signal line SWL2 is selected thereby. In the same manner as above, the intensity of laser beam L2, LB2 is controlled. After completing the control on the intensity of laser beam L2, LB2, a third timing signal is issued to control the next laser beam L3, LB3.

The above-discussed control procedure is repeated up to the last laser beam Ln, LBn. Upon the end of control on the intensity of the last laser beam, a final timing signal is applied which releases the switching circuit 35 and signal line SW1 from selection made by the selector 44. Therefore, the recording apparatus is ready for restart of data recording by applying input signals S1-Sn to signal lines iL1-iLn.

Figure 10:
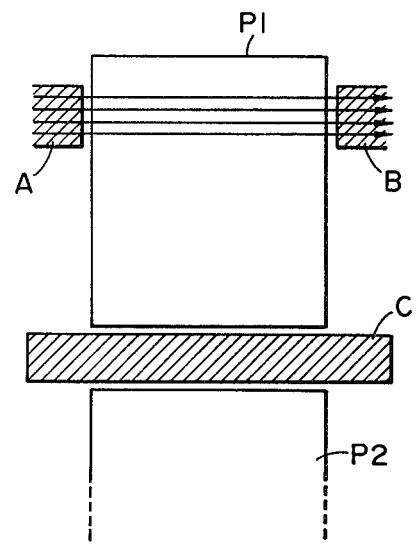
FIG. 10 is a schematic diagram of recording areas on the photosensitive drum of a recording apparatus.

FIG. 10 shows schematically and in time series a recording paper sheet on which data are recorded by a beam recording apparatus as described above.

Data are recorded on the recording areas P1 and P2 of which P1 stands for a unit area of one page and P2 for that of the next page. As suggested by A and B, the above-described control for the intensity of beams may be executed making use of the period during which the laser beam L is scanning the area out of the recording area P1. In this case, the timing signal described above may be issued in the rate of one signal per one scanning with beam L.

Control of the intensity of beams may be executed also making use of the idle time C which is a period between the end of recording on one page P1 and the start of recording on the next page P2.

While the invention has been particularly shown and described with reference to the preferred embodiments thereof, it will be understood by those skilled in the art that the foregoing and other changes in form and details can be made therein without departing from the spirit and scope of the invention.

What I claim is:

1. Apparatus for controlling the quantity of radiation emitted by emitting means, comprising:
   means for generating driving power;
   means for emitting radiation in response to the driving power generated by said driving power generating means;
   detector means for detecting the radiation emitted from said emitting means and producing a detection signal corresponding to the quantity of the detected radiation;
   means for producing a reference signal;
   means for comparing the detection signal with the reference signal;
   means for generating an instruction signal for initiating control of the quantity of radiation emitted by said emitting means;
   means for varying the driving power applied to said emitting means in response to generation of the instruction signal;
   means for stopping the variation of the driving power at one level in response to an output from said comparing means; and
   holding means for holding the driving power at the one level.

2. Apparatus according to claim 1, wherein said driving power varying means includes a counter and means for generating clock signals to be applied to said counter.

3. Apparatus according to claim 2, wherein said driving power varying means further includes digital-to-analog converting means for converting the count in said counter to an analog signal.

4. Apparatus according to claim 1 wherein said emitting means comprises a semiconductor laser.

5. Apparatus according to claim 4 wherein said semiconductor laser emits a front beam and a back beam, said detector means being so disposed as to receive said back beam.

6. Apparatus according to claim 5 which further comprises means for deflecting said front beam toward a recording medium.

7. Apparatus for controlling the quantity of radiation emitted by emitting means, comprising:
   means for generating variable driving power;
   radiation emitting means comprising a plurality of radiation emitting devices each for emitting radiation in response to driving power generated by said driving power generating means;
   detector means for detecting the emitted radiation from said emitting means and producing a detection signal corresponding to the quantity of detected radiation;
   selection means for selecting one of said plurality of radiation emitting devices to emit radiation in response to the driving power;
   means for making said detector means detect the radiation from said one selected device and controlling the quantity of the radiation emitted thereby in response to the driving power to a predetermined level; and means for applying a switching signal to said selection means to cause it to select another one of said radiation emitting devices.

8. Apparatus according to claim 7 wherein said emitting means comprises a semiconductor laser.

9. Apparatus according to claim 7 wherein said radiation quantity controlling means includes means for generating clock signals and a counter for counting said clock signals.

10. Apparatus according to claim 7 wherein said radiation quantity controlling means includes means for generating a signal the level of which changes with time.

11. Apparatus according to claim 8 wherein said semiconductor laser emits front beams and back beams, said detector means being disposed to receive all of the back beams.

12. Apparatus for controlling the quantity of radiation emitted by emitting means, comprising:
means for generating a recording signal;
radiation emitting means for emitting radiation modulated with a recording signal applied thereto by said generating means;
photodetector means for receiving the emitted radiation from said radiation emitting means and producing a detection output corresponding to the received radiation;
means for discriminating whether or not the duration time of said recording signal is longer than a predetermined time length; and
means for controlling the radiation emitted from sid radiation emitting means when the duration of said recording signal is longer than said predetermined time as discriminated by said discriminating means to adjust said detection output to a predetermined value.

13. Apparatus according to claim 12 wherein said control means includes means for generating clock signals and a counter for counting the clock signals.

14. Apparatus according to claim 12 wherein said control means includes means for generating a signal whose signal level changes with time.

15. Apparatus for controlling the quantity of radiation emitted by emitting means, comprising:
means for generating a driving signal;
means for emitting radiation in response to a driving signal generated by said driving signal generating means;
means for deflecting the emitted radiation from said radiation emitting means toward a recording medium;
photodetector means for receiving the emitted radiation from said radiation emitting means and producing a detection output corresponding to the received radiation;
means for producing a reference signal having a predetermined value;
discriminating means for comparing said detection output with the reference signal to make a discrimination as to whether or not said detection output has a predetermined value;
first control means for controlling said detection output in response to an output from said discriminating means in such a manner that said detection output can reach the predetermined value; and
second control means for controlling said detection output in such a manner that when said detection output could not be adjusted to said predetermined value by said first control means, said detection output is brought to a preset value by said second control means.

16. Apparatus for controlling the quantity of radiation emitted by beam generating means, comprising:
beam generating means for generating a plurality of front beams and a plurality of back beams projecting in the opposite direction to that of the front beams;
means for deflecting said front beams toward a recording medium;
photodetecting means disposed for receiving all of the back beams;
selection and driving means for making said beam generating means emit selectively one of the front beams and the corresponding one of the back beams; and
means for controlling said one back beam selected by said selection and driving means and received by said photodetection means so that the quantity of said received beams reaches a predetermined value.

17. Apparatus for controlling the quantity of radiation emitted by emitting means, comprising:
means for generating driving power;
means for emitting radiation in response to the driving power generated by said driving power generating means;
detector means for detecting the radiation emitted from said emitting means and producing a detection signal corresponding to the quantity of the detected radiation;
means for generating a signal for instructing the adjustment of the quantity of radiation emitted from said emitting means;
means responsive to the instruction signal for gradually varying the driving power after bringing the driving power generating means to a predetermined level; and
means for holding the driving power constant when the detection signal from said detector means reaches a predetermined value.

18. Recording device with apparatus for controlling the quantity of radiation emitted by emitting means, comprising:
means for generating a light beam;
recording means for recording information on a recording medium on a page-by-page basis by means of said light beam generating means;
means for introducing timing signals generated after the end of one page recording and before the start of the next page recording;
control means for bringing an intensity of the light beam generated by said light beam generating means to a predetermined value in response to the introduction of the timing signals; and
hold means for holding the intensity of the light beam brought to the predetermined value with said control means.

* * * * *